(12) United States Patent
Jeon et al.

(10) Patent No.: US 7,141,473 B2
(45) Date of Patent: Nov. 28, 2006

(54) SELF-ALIGNED 1 BIT LOCAL SONOS MEMORY CELL AND METHOD OF FABRICATING THE SAME

(75) Inventors: Hee-seog Jeon, Hwaseong-si (KR); Seung-beom Yoon, Suwon-si (KR); Yong-tae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 249 days.

(21) Appl. No.: 10/912,046

(22) Filed: Aug. 6, 2004

(65) Prior Publication Data

US 2005/0029574 A1 Feb. 10, 2005

(30) Foreign Application Priority Data

Aug. 8, 2003 (KR) .............. 10-2003-0055030

(51) Int. Cl.
*H01L 21/336* (2006.01)
(52) U.S. Cl. .......... 438/257; 438/261; 438/267
(58) Field of Classification Search ............. 438/197, 438/257, 261, 264, 266, 267; 257/315, 324
See application file for complete search history.

(56) References Cited

U.S. PATENT DOCUMENTS 6,335,554 B1 1/2002 Yoshikawa
6,413,821 B1 7/2002 Ebina et al.
6,559,500 B1 * 5/2003 Torii ..................... 257/315
7,037,781 B1 * 5/2006 Choi et al. ............. 438/257
7,064,378 B1 * 6/2006 Jeon et al. .............. 257/315
2002/0137296 A1 9/2002 Satoh et al.

FOREIGN PATENT DOCUMENTS

JP 2001-156188 6/2001
KR 2002-0069126 8/2002

* cited by examiner

*Primary Examiner*—Tuan H. Nguyen
(74) *Attorney, Agent, or Firm*—Lee & Morse, P.C.

(57) ABSTRACT

A self-aligned 1 bit silicon oxide nitride oxide silicon (SONOS) cell and a method of fabricating the same has high uniformity between adjacent SONOS cells, since the lengths of nitride layers do not vary due to misalignment when etching word lines of the 1 bit SONOS cells. An insulating layer pattern that forms a sidewall of a word line is formed on a semiconductor substrate, and a word line for a gate is formed on the sidewall thereof. Etching an ONO layer using a self-aligned etching spacer provides uniform adjacent SONOS cells.

14 Claims, 7 Drawing Sheets

US 7,141,473 B2

SELF-ALIGNED 1 BIT LOCAL SONOS MEMORY CELL AND METHOD OF FABRICATING THE SAME

BACKGROUND OF THE INVENTION

1. Field of the Invention

The present invention relates to a semiconductor device. More particularly, the present invention relates to a local silicon oxide nitride oxide silicon (SONOS) cell of a non-volatile memory (NVM) and a method of fabricating the same.

2. Description of the Related Art

Semiconductor memory devices are classified into volatile memories and NVMs according to whether data is lost or maintained, respectively, when power is terminated. Volatile memories, such as DRAMs, lose stored data when power is halted. In contrast, no data is lost in NVMs, such as flash memories, even when power is halted.

Therefore, NVMs have been widely used for devices that are not likely to have a continuous supply of power, such as mobile phone systems and devices that require a memory card for storing music and video data, or for electronic appliances that may abruptly lose power.

Generally, a memory cell of an NVM has a stack type gate structure, and can be a SONOS cell. The SONOS cell is constructed by sequentially stacking, on a first silicon layer, an oxide layer that forms a channel region on a semiconductor device, a nitride layer used as a charge trapping layer, an oxide layer used as a blocking layer, and a second silicon layer used as a control gate electrode.

In a conventional method of fabricating a 1 bit SONOS cell, a charge trapping layer formed by a photolithography process, and more specifically, a length of a nitride layer serving as this charge trapping layer, significantly affects characteristics of a NVM. The nitride layer used as the charge trapping layer is formed by etching that is performed twice. Currently, variation in length of the nitride layer arising from misalignment during etching is one factor that adversely affects uniformity of the local SONOS cell.

FIGS. 1 through 8 illustrate cross-sectional views of stages of a method of fabricating a local SONOS cell of a conventional NVM.

Referring to FIGS. 1 through 4, an ONO layer 101, 102, and 103 is formed by sequentially stacking a first oxide layer 101, a nitride layer 102 and a second oxide layer 103 on a semiconductor substrate 100, as shown in FIG. 1. A first photoresist pattern 104 is formed on the second oxide layer 103, as shown in FIG. 2. The ONO layer 101, 102, and 103 is etched using the first photoresist pattern 104 as an etch mask, with the resultant structure shown in FIG. 3. After removing the first photoresist pattern 104, an upper oxide layer 105 is formed on the resultant structure, as shown in FIG. 4.

Referring to FIGS. 5 through 8, a conductive polysilicon layer 106 is formed on the upper oxide layer 105, as shown in FIG. 5. Then, a second photoresist pattern 111 is formed on the conductive polysilicon layer 106, as shown in FIG. 6. The second photoresist pattern 111 is used as an etch mask during etching of the polysilicon layer 106, the upper oxide layer 105 and the ONO layer 101, 102 and 103, with the resultant structure shown in FIG. 7. Then, the second photoresist pattern 111 is removed, and impurity junction regions 109 and 110 are formed in the substrate 100, as shown in FIG. 8.

However, the conventional method of fabricating the local SONOS cell of the NVM has the following disadvantages.

If misalignment occurs when the first photoresist pattern 104 is formed or used to etch the underlying layers, lengths 107a and 107b of the nitride layer 108 used as the charge trapping layer may be different in adjacent 1 bit SONOS cells.

Also, if misalignment occurs when the second photoresist pattern 111 is formed or used to etch the underlying layers, the lengths 107a and 107b of the nitride layer 108 used as the charge trapping layer may be different in adjacent 1 bit SONOS cells.

The length variation of the nitride layer 108 occurring in adjacent 1 bit SONOS cells arising from the foregoing misalignment degrades uniformity of the 1 bit SONOS cell, which in turn degrades characteristics of the NVM. More specifically, as the length of the nitride layer 108 used as the charge trapping layer increases, data programming characteristics of the 1 bit SONOS cell are improved, but data erasing characteristics of the 1 bit SONOS cell are degraded. On the other hand, as the length of the nitride layer 108 decreases, data erasing characteristics are improved, but data programming characteristics are degraded.

SUMMARY OF THE INVENTION

The present invention is therefore directed to a SONOS memory cell and method of fabrication which substantially overcomes one or more of the problems due to the limitations and disadvantages of the related art.

It is a feature of an embodiment of the present invention to provide adjacent self-aligned 1 bit SONOS cells that are uniform by preventing variations in lengths of a nitride layer used as a charge trapping layer by using self-aligned etching when forming the 1 bit SONOS cells.

It is another feature of the present invention to provide a method of fabricating a self-aligned 1 bit SONOS cell using self-aligned etch masks.

It is yet another feature of the present invention to provide uniform adjacent 1 bit SONOS cells having an integral structure symmetric about the drain region.

At least one of the above and other features and advantages may be realized by providing a method of fabricating a self-aligned 1 bit silicon oxide nitride oxide silicon (SONOS) cell, including forming an insulating layer pattern having a substantially rectangular shape with two opposing sidewalls on a semiconductor substrate, forming an ONO layer including a lower oxide layer, a nitride layer and an upper oxide layer, the ONO layer having a uniform thickness on the semiconductor substrate and the insulating layer pattern, forming self-aligned etching spacers on both sidewalls of the insulating layer pattern, etching portions of an upper oxide layer and a nitride layer of the ONO layer on the insulating layer pattern using the self-aligned etching spacers as an etch mask, removal the self-aligned etching spacers, removing the upper oxide layer exposed by the removing of the self-aligned etching spacers and the lower oxide layer of the ONO layer on the semiconductor substrate, forming an oxide layer on a resultant structure on the semiconductor substrate, and forming a word line for a gate of the SONOS cell using the sidewalls of the insulating layer pattern as a sidewall for the word line.

The forming of the insulating layer pattern may include forming a first insulating layer pattern having a trench on the semiconductor substrate, forming second insulating layer spacers on sidewalls of the trench, filling the trench with a third insulating layer, planarizing the third insulating layer, and removing the first insulating layer, thereby forming the insulating layer pattern of the second and the third insulating layers.

After forming the second insulating layer spacer, ion implantation may be performed to form a doped drain region in the semiconductor substrate below the trench. The first insulating layer may be a nitride layer. The second insulating layer may be an oxide layer. The third insulating layer may be an oxide layer. The second insulating layer spacer may be formed by reactive ion etching (RIE). The third insulating layer may be planarized by chemical mechanical polishing (CMP).

The self-aligned etching spacer may be a polysilicon. The self-aligned etching spacer may be formed by RIE. The self-aligned etching spacer may be thinner than the word line for the gate. A thermal treatment may be performed after forming the oxide layer. The forming the word line for the gate of the SONOS cell may include depositing a conductive polysilicon layer on the oxide layer and etching the conductive polysilicon layer. Ion implantation using the insulating layer pattern and the word line for the gate of the SONOS cell as an ion implantation mask, may be performed after forming the word line for the gate of the SONOS cell, thereby forming a doped source region.

At least one of the above and other features and advantages of the present invention may be realized by providing a self-aligned 1 bit SONOS cell, including a semiconductor substrate, a doped drain region for a drain formed in a predetermined portion of the semiconductor substrate, an insulating layer pattern that forms a sidewall of a word line, the insulating pattern being on the doped drain region, a doped source region on a predetermined portion of the semiconductor substrate, the doped source region being separated from the doped drain region by an interposing channel region, an ONO layer disposed on one sidewall of the insulating layer pattern and on a portion of the channel region, a gate insulating layer formed on the channel region where the ONO layer is not formed, and a spacer-shaped word line for a gate disposed on the ONO layer disposed on the sidewall of the insulating layer pattern, and on upper surfaces of the ONO layer and gate insulating layer.

The insulating layer pattern may include second insulating layer spacers and a third insulating layer that fills a region between the second insulating layer spacers. The nitride layer of the ONO layer may be L-shaped. A second self-aligned 1 bit SONOS cell may be formed symmetrically on an opposite sidewall of the insulating layer pattern. The doped drain region for the drain may be formed using the second insulating layer spacers as an ion implantation mask.

The insulating layer pattern may further include an oxide layer formed of the same material as the gate insulating layer.

According to the present invention, the lengths of the nitride layers used as the charge trapping layers in the 1 bit SONOS cell of NVM are uniform and thus, all 1 bit SONOS cells of the NVM are uniform.

BRIEF DESCRIPTION OF THE DRAWINGS

The above and other features and advantages of the present invention will become more apparent to those of skill in the art by describing in detail exemplary embodiments thereof with reference to the attached drawings in which.

DETAILED DESCRIPTION OF THE INVENTION

Figure 1:
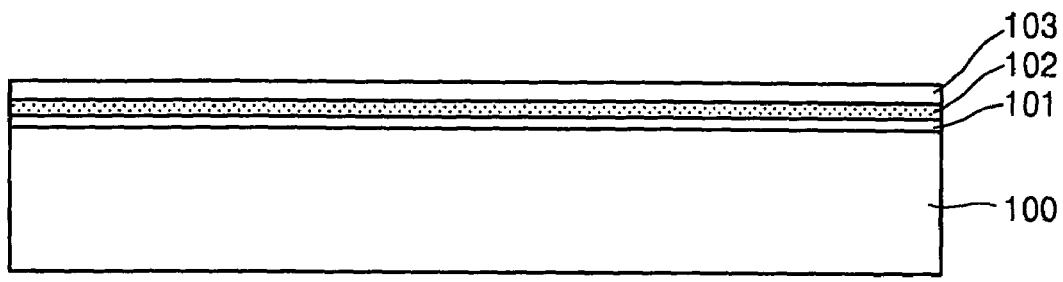
FIGS. 1 through 8 illustrate cross-sectional views of stages of a method of fabricating a local SONOS cell of a conventional NVM.
Figure 2:
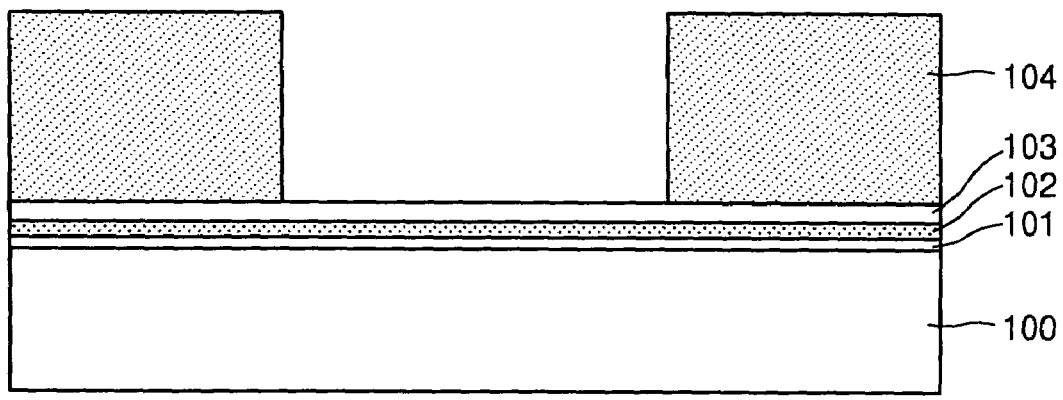
Figure 3:
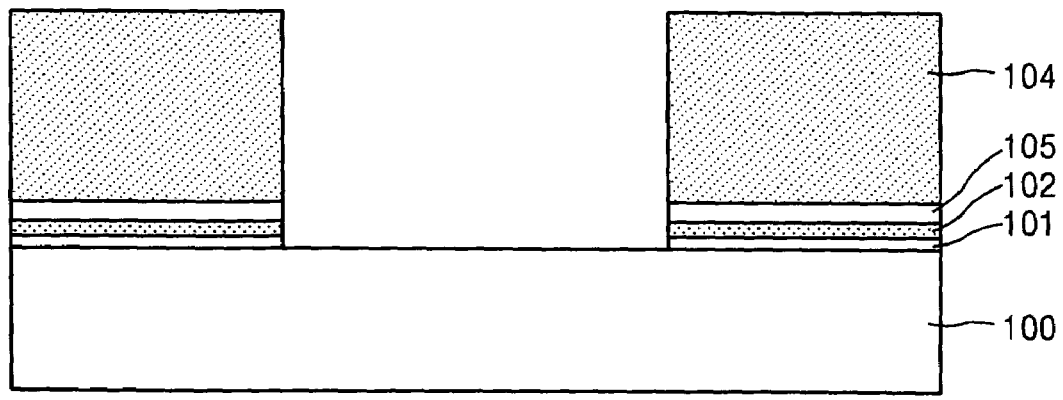
Figure 4:
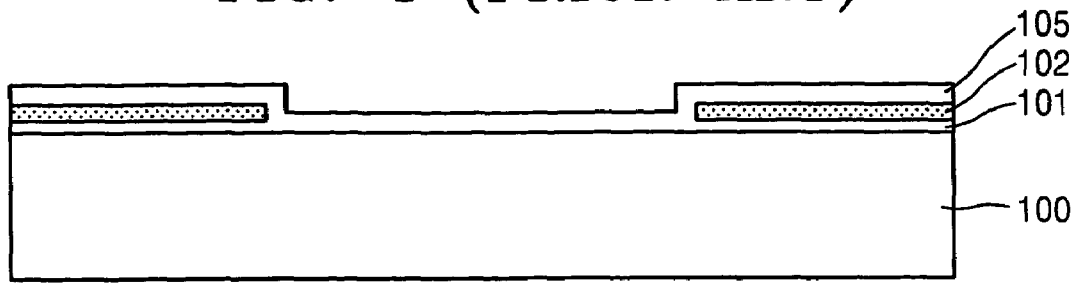
Figure 5:
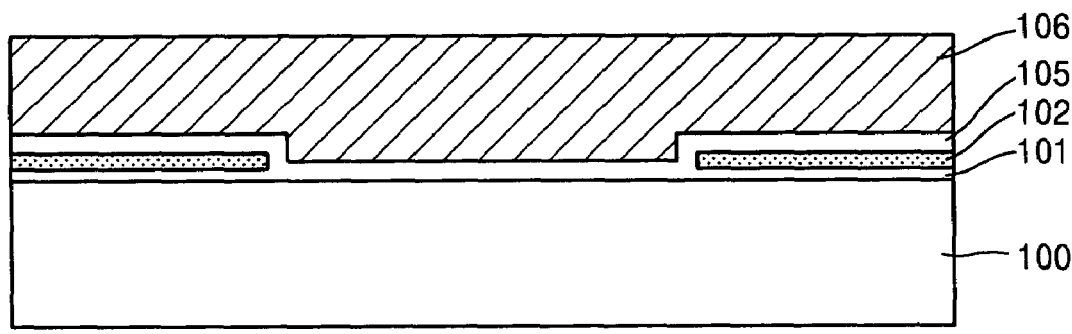
Figure 6:
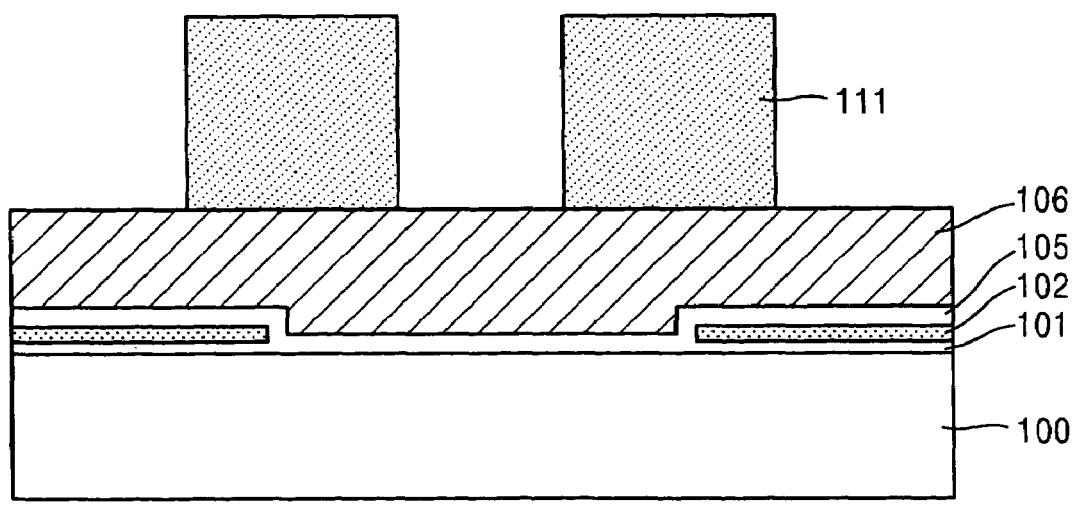
Figure 7:
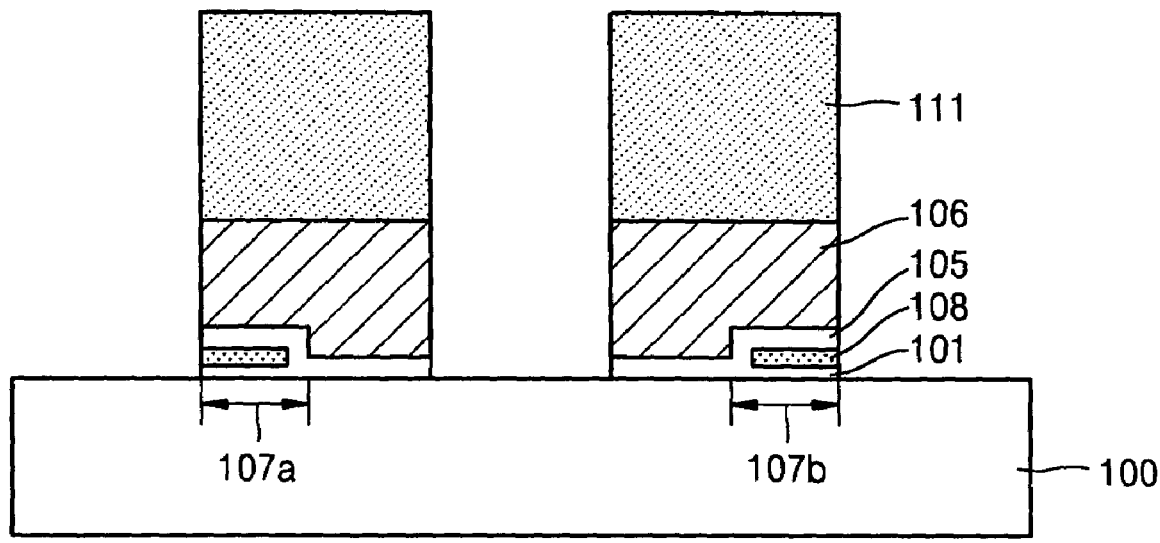
Figure 8:
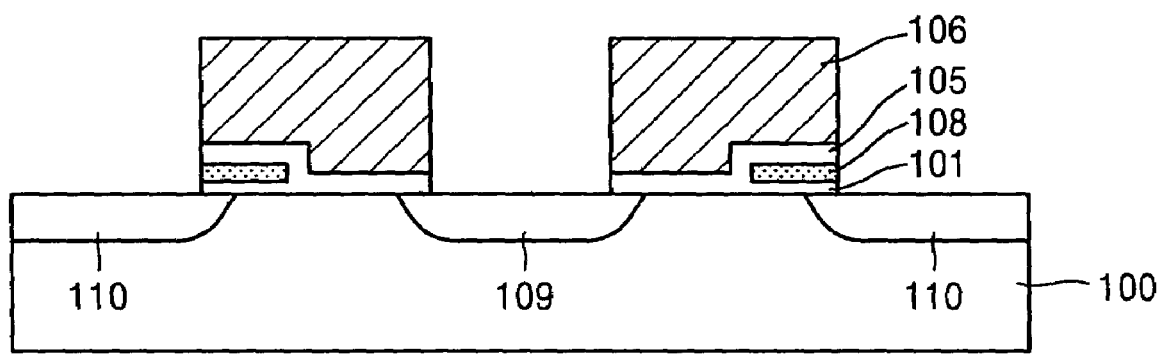

Korean Patent Application No. 2003-55030, filed on Aug. 8, 2003, in the Korean Intellectual Property Office, and entitled "1 Bit Local SONOS Memory Cell Using Self Aligned Etching and Method of Fabricating the Same," is incorporated in its entirety by reference herein.

The present invention will now be described more fully with reference to the accompanying drawings, in which exemplary embodiments of the invention are shown. This invention may, however, be embodied in many different forms and should not be constructed as being limited to the embodiments set forth herein; rather, these embodiments are provided so that this disclosure will be thorough and complete, and will fully convey the concept of the invention to those skilled in the art. In the figures, the dimensions of layers and regions are exaggerated for clarity of illustration.

It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 9:
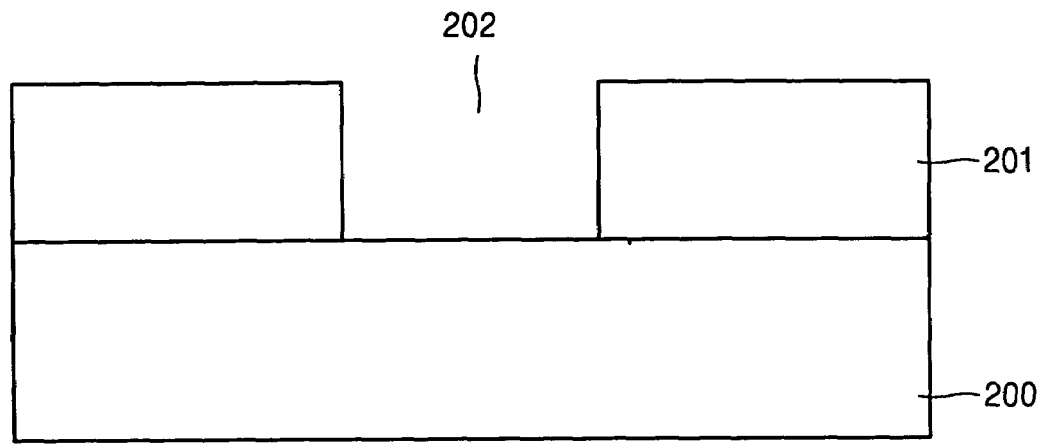
FIGS. 9 through 17 illustrate cross-sectional views of stages of a method of fabricating a local SONOS cell of a NVM according to an embodiment of the present invention.

Referring to FIG. 9, an isolation process is performed on a semiconductor substrate 200 to form a field oxide layer (not shown), using any conventional method. Subsequently, a first insulating layer, e.g., a nitride layer, is deposited, e.g., using chemical vapor deposition (CVD), on the semiconductor substrate 200 to a thickness of about 1000 to 3000 Å. The first insulating layer is patterned, e.g., using photolithography, to form a first insulating layer pattern 201 having a centrally located trench 202.

Figure 10:
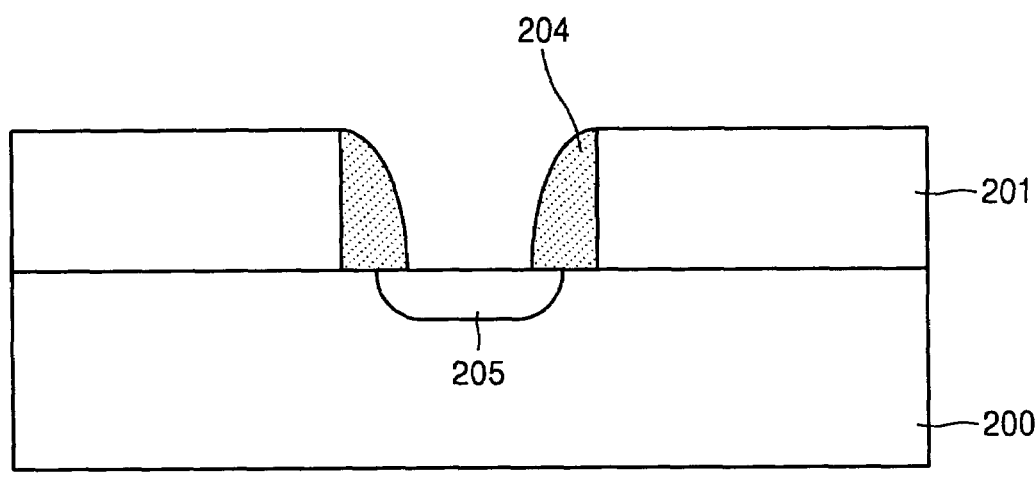

Referring to FIG. 10, after forming a second insulating layer, e.g., an oxide layer, on the semiconductor substrate 200 and the first insulating layer pattern 201, the second insulating layer is selectively removed, e.g., using reactive ion etching (RIE), thereby forming a second insulating layer spacer 204 on a sidewall of the trench 202. The first insulating layer pattern 201 and the second insulating layer spacer 204 are used as ion implantation masks during ion implantation, thereby forming a doped region 205, e.g., a $n^+$-doped region, in the semiconductor substrate 200. The second insulating layer spacer 204 is formed to overlap a control junction area of a word line transistor formed in a subsequent process, which may be omitted if unnecessary.

Figure 11:
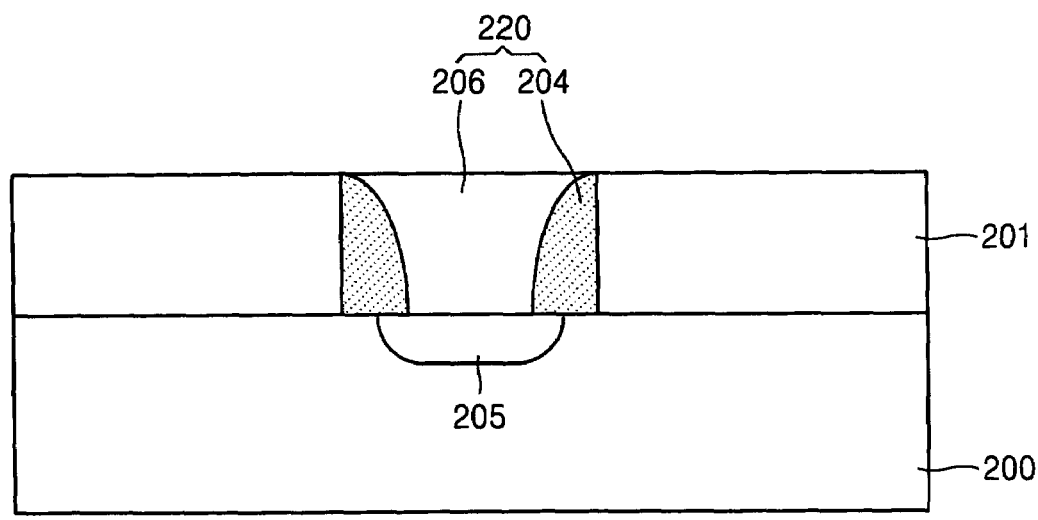

Referring to FIG. 11, a third insulating layer 206, e.g., an oxide layer, is formed, e.g., using CVD, to a thickness of about 1000 to 5000 Å on the semiconductor substrate 200, the first insulating layer pattern 201 and the second insulating layer spacer 204 to fill the trench 202. Then, the first insulating layer pattern 201 is used as a polishing stop layer when performing planarizing, e.g., using chemical mechanical polishing (CMP), such that the third insulating layer 206 exists only in the trench 202. At this time, the second insulating layer spacer 204 and the third insulating layer 206, which fill the trench 202, are used as an insulating layer pattern 220 that forms a sidewall word line.

Figure 12:
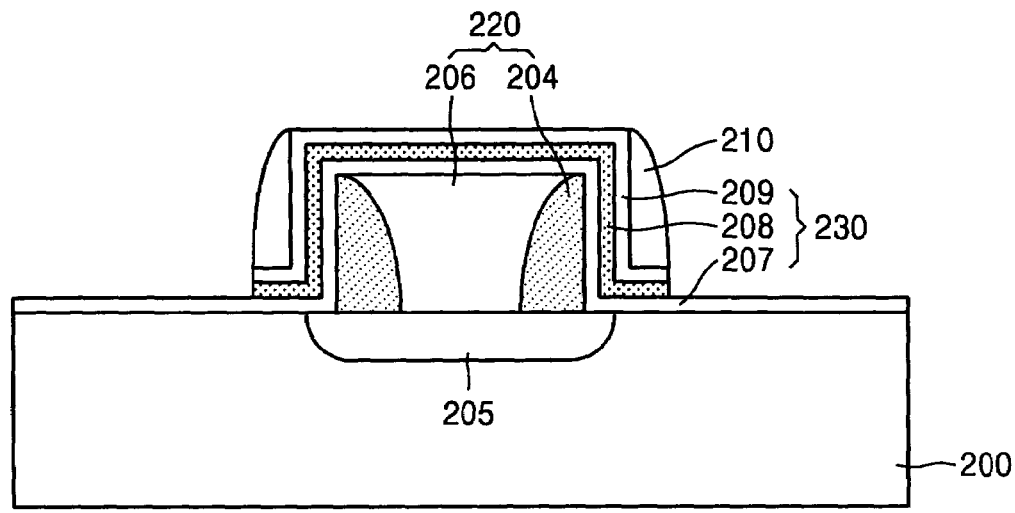

Referring to FIG. 12, the first insulating layer pattern 201 is removed, e.g., using wet etching performed for about 100 to 300 minutes using a phosphoric acid ($H_3PO_4$) solution as an etchant. The insulating layer pattern 220 remaining on the substrate 200 has a substantially rectangular shape with opposing sidewalls. Successively, an ONO layer 230, including a lower oxide layer 207, a nitride layer 208, and an upper oxide layer 209, is formed on the semiconductor substrate 200 and the insulating layer pattern 220. The lower oxide layer 207 is a tunneling layer, which may be formed, e.g., using thermal oxidation, to a thickness of about 60 to 130 Å. The nitride layer 208 is a charge trapping layer, which may be formed, e.g., using CVD, to a thickness of about 40 to 120 Å. The upper oxide layer 209 is a blocking layer, which may be formed, e.g., using CVD, to a thickness of about 50 to 80 Å.

An undoped polysilicon layer may be deposited on the ONO layer 230 to a thickness of about 200 to 1000 Å. Then, a portion of the undoped polysilicon layer is removed, e.g., using RIE, to form a self-aligned etching spacer 210 on each sidewall of the ONO layer 230 formed on the sidewalls of the insulating layer pattern 220. In addition to polysilicon, the self-aligned etching spacer 210 may be formed of any material that can be formed into a spacer via patterning, e.g., using RIE, and has an etch selectivity with respect to a material of an adjoining layer.

After the RIE, the thickness of the undoped polysilicon layer determines a width of the self-aligned etching spacer 210 and a final length of the underlying nitride layer 208, which is the charge trapping layer. In other words, the final length of the nitride layer 208 used as the charge trapping layer depends on the thickness of the undoped polysilicon layer. Therefore, the undoped polysilicon layer is thinner than a conductive polysilicon layer that forms a word line for a gate used in a subsequent process.

Figure 13:
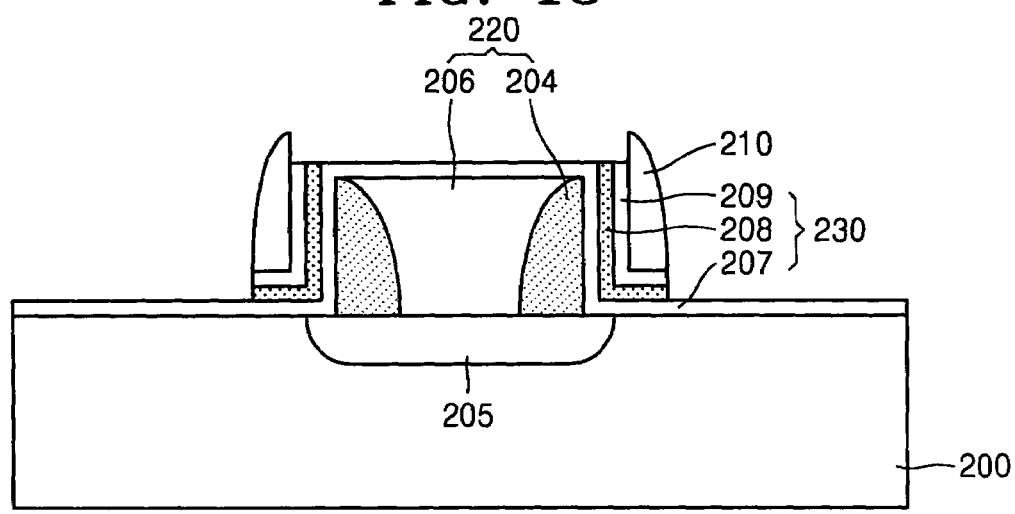

Referring to FIG. 13, the self-aligned etching spacer 210 is used as an etch mask during removal of an exposed portion of the upper oxide layer 209 and the nitride layer 208 of the ONO layer 230 on the insulating layer pattern 220 in a self-aligned manner. Accordingly, the nitride layer 208, i.e., the charge trapping layer, can be formed to have equal lengths on both sides of the insulating layer pattern 220.

As described above, because of the self-aligned etching spacer 210, the nitride layer 208 used as the charge trapping layer has the same length on both sides of the insulating layer pattern 220. As a result, length variations of the nitride layer 208 of adjacent word line transistors can be decreased. Thus, a plurality of 1 bit SONOS cells of the NVM having uniform characteristics can be formed.

Figure 14:
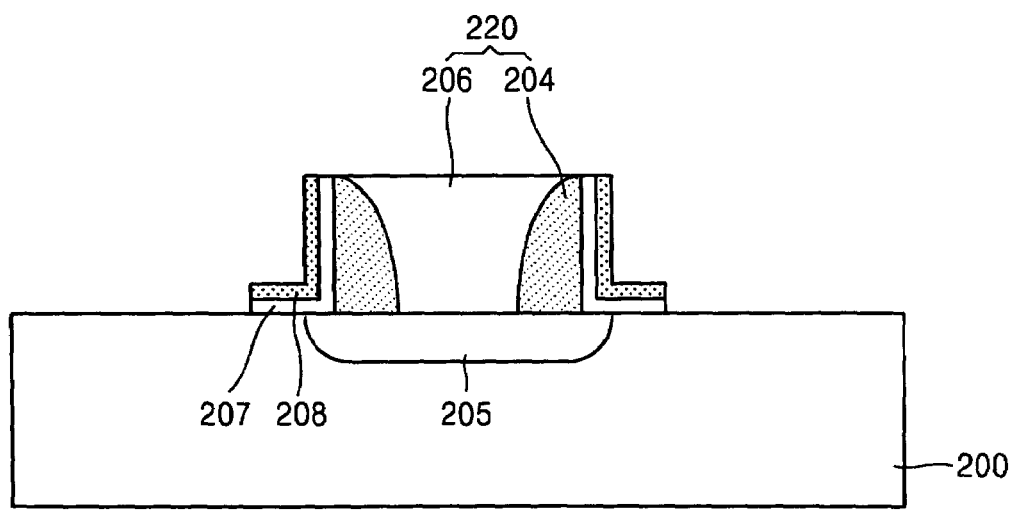

Referring to FIG. 14, the self-aligned etching spacer 210 is removed from the insulating layer pattern 220 and the ONO layer 230, e.g., by wet etching. At this time, the lower oxide layer 207 remaining on the semiconductor substrate 200 and the upper oxide layer 209 on the insulating layer pattern 220 are also removed. A resultant structure is shown in FIG. 14.

Figure 15:
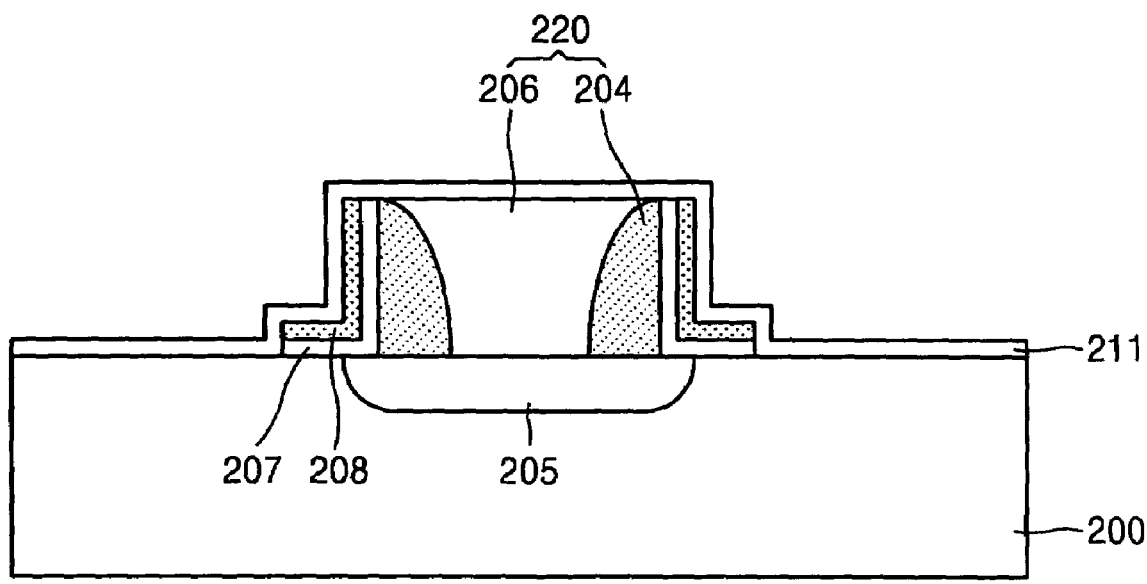

Referring to FIG. 15, an oxide layer 211 is deposited, e.g., using CVD, to a thickness of about 20 to 100 Å on the resultant structure on the semiconductor substrate 200. Then, thermal treatment is performed for about 20 to 30 minutes at a temperature of about 950 to 1100° C., to activate the doped region 205 formed below the insulating layer pattern 220.

Figure 16:
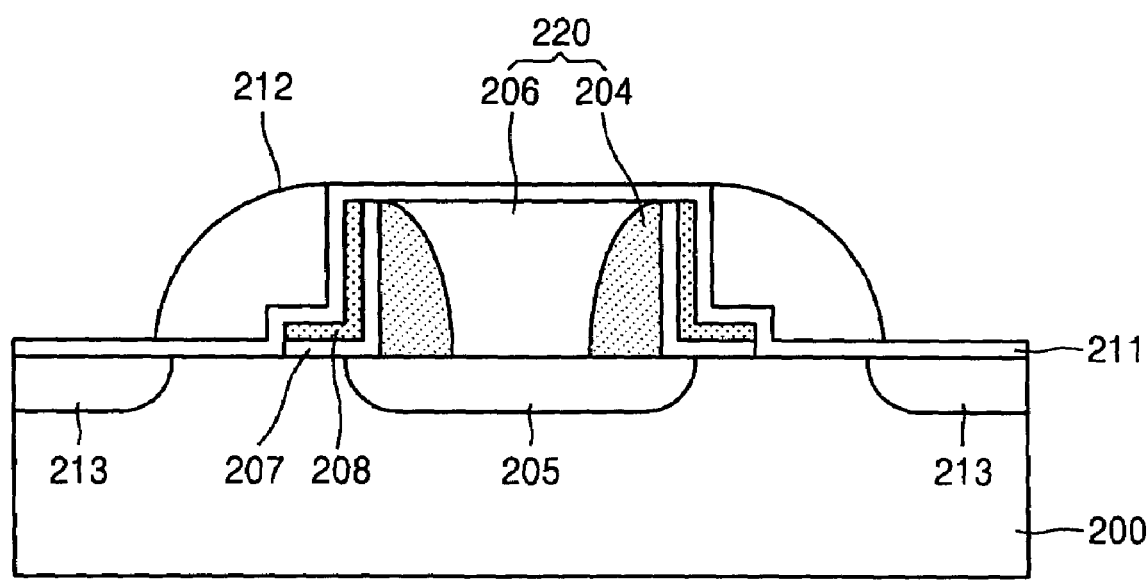

Referring to FIG. 16, a polysilicon layer is made conductive by being doped with an impurity. This conductive polysilicon layer is deposited to a thickness of about 1000 to 3000 Å on the oxide layer 211. The conductive polysilicon layer is removed, e.g., by RIE, to form gate word lines 212 that act as word line transistors. The word lines 212 are formed on both sides of the insulating layer pattern 220. Each of the word lines 212 functions as a 1 bit SONOS cell. The word lines 212 and the insulating layer pattern 220 are used as ion implantation masks when a doped source region 213, e.g., an $n^+$-doped source region, is formed in the semiconductor substrate 200.

Hereinafter, a structure and characteristics of the self-aligned 1 bit SONOS cell according to an embodiment of the present invention will be described with reference to FIG. 16.

The self-aligned 1 bit SONOS cell includes the semiconductor substrate 200 and the doped drain region 205 formed in a predetermined region of the semiconductor substrate 200. The insulating layer pattern 220 forming a sidewall word line is disposed on the doped drain region 205. Also, the doped source region 213 disposed in a predetermined region of the semiconductor substrate 200 is spaced apart from the doped drain region 205 by a predetermined distance, with a channel region interposed therebetween. The ONO layer 230 is disposed on a sidewall of the insulating layer pattern 220 and on a portion of the channel region. The gate insulating layer 211 is disposed on the entire channel region other than where the ONO layer 230 is formed. The word line 212, shaped as a spacer, is disposed on the ONO layer 230 on the sidewall of the insulating layer pattern 220, and on upper portions of the ONO layer 230 and the gate insulating layer 211.

The self-aligned 1 bit SONOS cell according to an embodiment of the present invention includes forming the insulating layer pattern 220 that forms the word line sidewall and the word line 212 on the sidewall thereof, which allows the nitride layer 208, which is the charge trapping layer, to have a same length on both sides of the insulating layer pattern 220. Furthermore, since the self-aligned etching spacers (210 in FIG. 12) are used in the manufacturing of the 1 bit SONOS cell, the L-shaped nitride layer 208 can be formed without misalignment in the adjacent 1 bit SONOS cells. The L-shaped nitride layer 208 acts as a charge trapping layer capable of storing charges on an edge of the doped source region 213.

Figure 17:
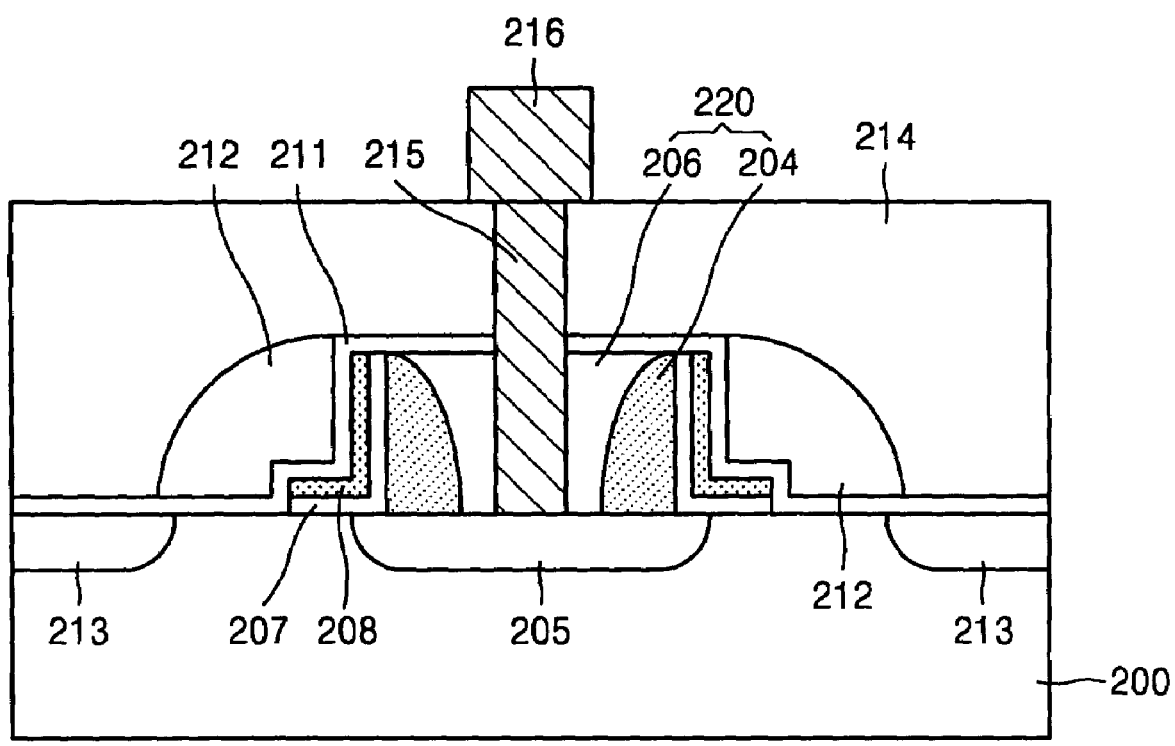

Referring to FIG. 17, an interlayer insulating layer 214, e.g., a composite layer of an oxide base layer, is formed on the gate insulating layer 211 and the word line 212. Subsequently, a contact hole is formed in the interlayer insulating layer 214, and a bit line contact 215 is formed in the contact hole using a contact plug of an electrically conductive material, e.g., tungsten or aluminum. Finally, a bit line 216, e.g., an aluminum interconnect, is formed on the interlayer insulating layer 214 and the bit line contact 215.

Therefore, as described above, in the 1 bit SONOS cell of the NVM according to an embodiment of the present invention, the insulating layer pattern that forms the word line sidewall and the self-aligned etching spacer are used to form the nitride layer used as the charge trapping layer uniform with a predetermined length, thereby improving uniformity of the NVM.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a self-aligned 1 bit silicon oxide nitride oxide silicon (SONOS) cell, comprising:

forming an insulating layer pattern having a substantially rectangular shape with two opposing sidewalls on a semiconductor substrate;

forming an ONO layer including a lower oxide layer, a nitride layer and an upper oxide layer on the semiconductor substrate and the insulating layer pattern, the ONO layer having a uniform thickness;

forming self-aligned etching spacers on both sidewalls of the insulating layer pattern;

etching portions of the upper oxide layer and the nitride layer of the ONO layer on the insulating layer pattern using the self-aligned etching spacers as an etch mask;

removing the self-aligned etching spacers;

removing the upper oxide layer exposed by the removing of the self-aligned etching spacers and the lower oxide layer of the ONO layer on the semiconductor substrate;

forming an oxide layer on a resultant structure on the semiconductor substrate; and forming a word line for a gate of the SONOS cell using the sidewalls of the insulating layer pattern as a sidewall for the word line.

2. The method as claimed in claim 1, wherein forming the insulating layer pattern comprises:

forming a first insulating layer pattern having a trench on the semiconductor substrate;

forming second insulating layer spacers on sidewalls of the trench;

filling the trench with a third insulating layer;

planarizing the third insulating layer; and removing the first insulating layer, thereby forming the insulating layer pattern of the second and the third insulating layers.

3. The method as claimed in claim 2, further comprising, after forming the second insulating layer spacer, performing ion implantation to form a doped drain region in the semiconductor substrate below the trench.

4. The method as claimed in claim 2, wherein the first insulating layer comprises a nitride layer.

5. The method as claimed in claim 2, wherein the second insulating layer comprises an oxide layer.

6. The method as claimed in claim 2, wherein the third insulating layer comprises an oxide layer.

7. The method as claimed in claim 2, wherein the second insulating layer spacer is formed by reactive ion etching (RIE).

8. The method as claimed in claim 2, wherein the third insulating layer is planarized by chemical mechanical polishing (CMP).

9. The method as claimed in claim 1, wherein the self-aligned etching spacer is formed of polysilicon.

10. The method as claimed in claim 1, the self-aligned etching spacer is formed by RIE.

11. The method as claimed in claim 1, wherein the self-aligned etching spacer is thinner than the word line for the gate.

12. The method as claimed in claim 1, further comprising, after forming the oxide layer, performing thermal treatment.

13. The method as claimed in claim 1, wherein forming the word line for the gate of the SONOS cell comprises:

depositing a conductive polysilicon layer on the oxide layer; and etching the conductive polysilicon layer.

14. The method claimed in claim 1, further comprising, after forming the word line for the gate of the SONOS cell, performing ion implantation using the insulating layer pattern and the word line for the gate of the SONOS cell as an ion implantation mask, thereby forming a doped source region.

* * * * *